(12) United States Patent
Davis

(10) Patent No.: US 9,360,651 B2
(45) Date of Patent: Jun. 7, 2016

(54) COVERT ROOFTOP VENT ENCLOSURE AND ADJUSTABLE MULTI-TIERED RACK FOR ELECTRONIC SURVEILLANCE EQUIPMENT

(76) Inventor: Scott Davis, Seattle, WA (US)

( * ) Notice: Subject to any disclaimer, the term of this patent is extended or adjusted under 35 U.S.C. 154(b) by 370 days.

(21) Appl. No.: 13/553,577

(22) Filed: Jul. 19, 2012

(65) Prior Publication Data

US 2013/0182340 A1    Jul. 18, 2013

Related U.S. Application Data

(60) Provisional application No. 61/509,117, filed on Jul. 19, 2011.

(51) Int. Cl.
*G02B 7/02* (2006.01)
*F16M 13/02* (2006.01)
*G03B 17/02* (2006.01)

(52) U.S. Cl.
CPC ................ *G02B 7/02* (2013.01); *F16M 13/02* (2013.01); *F16M 13/022* (2013.01); *G03B 17/02* (2013.01)

(58) Field of Classification Search
USPC .......................................... 359/819
See application file for complete search history.

(56) References Cited

U.S. PATENT DOCUMENTS

| | | | | |
|---|---|---|---|---|
| 3,672,269 A | * | 6/1972 | Tabankin | 396/427 |
| 2006/0057332 A1 | * | 3/2006 | Li | 428/131 |

* cited by examiner

*Primary Examiner* — Jack Dinh
(74) *Attorney, Agent, or Firm* — Richard T. Black; Foster Pepper PLLC

(57) ABSTRACT

An apparatus for supporting electronic equipment on the exterior of an outdoor structure includes a base member configured to be coupled to the exterior of the outdoor structure, a first housing coupled to the base member, and at least one shelf disposed within the first housing. Each shelf includes a support surface, a plurality of support orifices disposed therethrough, and at least one first communication orifice disposed therethrough. A plurality of support members is configured to be inserted through the support orifices. A floor member is coupled to the first housing and has at least one second communication orifice disposed therethrough. The plurality of support members is configured to couple the at least one shelf to the floor member. A substantially transparent second housing is mounted on the floor member.

6 Claims, 7 Drawing Sheets

COVERT ROOFTOP VENT ENCLOSURE AND ADJUSTABLE MULTI-TIERED RACK FOR ELECTRONIC SURVEILLANCE EQUIPMENT

PRIORITY CLAIM

This application claims priority from U.S. Provisional Application No. 61/509,117 filed Jul. 19, 2011, which is hereby incorporated by reference in its entirety as if fully set forth herein.

COPYRIGHT NOTICE

This disclosure is protected under United States and/or International Copyright Laws. ©2011 Scott Davis. All Rights Reserved. A portion of the disclosure of this patent document contains material which is subject to copyright protection. The copyright owner has no objection to the facsimile reproduction by anyone of the patent document or the patent disclosure, as it appears in the Patent and/or Trademark Office patent file or records, but otherwise reserves all copyright rights whatsoever.

BACKGROUND OF THE INVENTION

There is a continuing need in our country for covert surveillance to protect our citizens from terrorists, as well as other predatorial, criminal or mischievous activity.

BRIEF DESCRIPTION OF THE DRAWING

The above and further advantages of the invention may be better understood by referring to the following description taken in conjunction with the accompanying drawing, in which.

DETAILED DESCRIPTION OF THE PREFERRED EMBODIMENT

In alternative embodiments of the invention, a covert rooftop vent enclosure is disguised as a common structure, such as a transformer, an industrial metal chimney, air conditioning unit, or other structure found on the top of a building.

Figure 1:
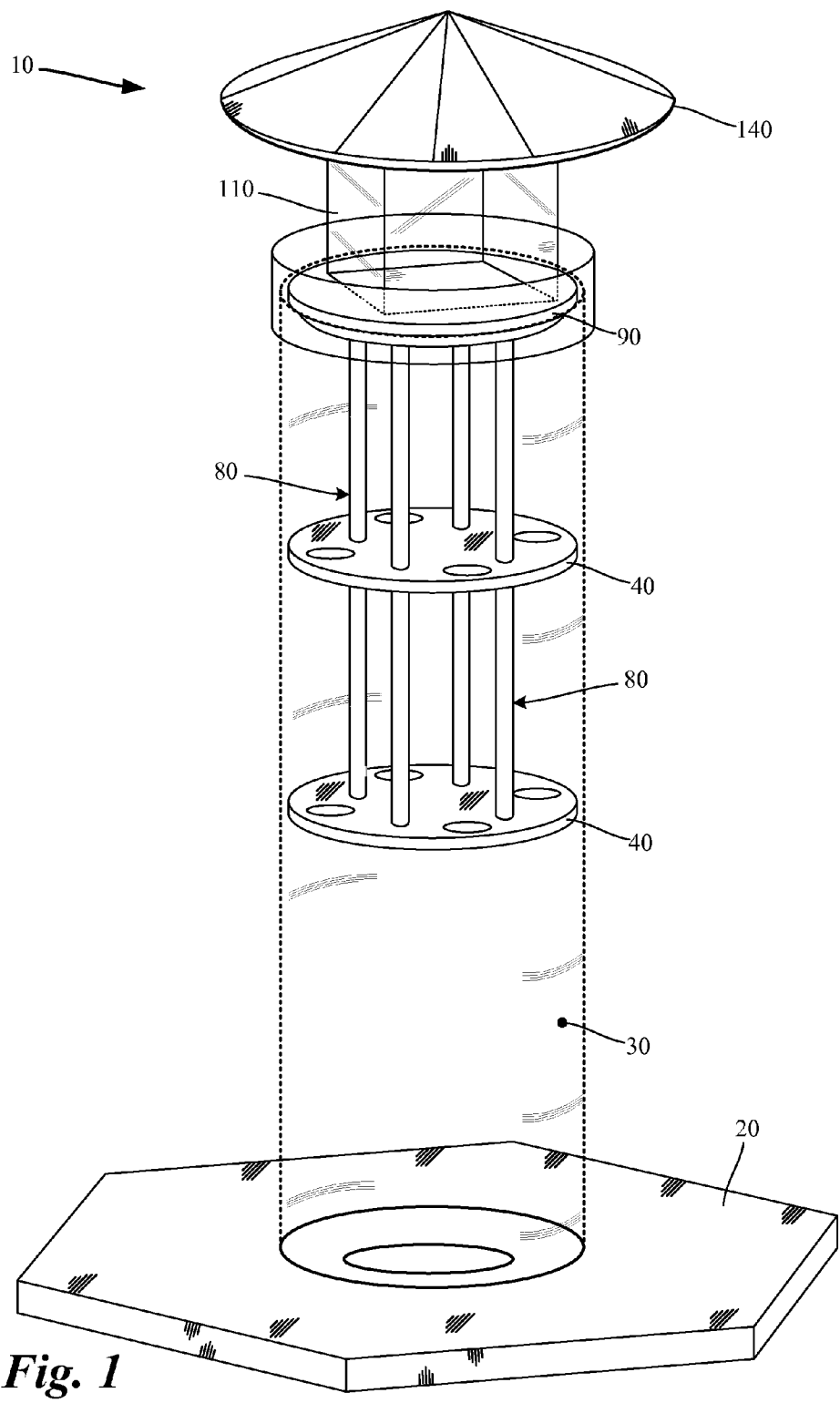
FIG. 1 is a side perspective view of an illustrative embodiment of a rooftop vent enclosure in accordance with the invention.

Specifically, and referring to FIG. 1, an exemplary rooftop vent enclosure 10 for supporting electronic equipment, such as a surveillance camera and associate equipment (not shown), on the exterior of an outdoor structure, such as a rooftop (not shown) is illustrated. Enclosure 10 includes a base member 20, configured to be coupled to the exterior of the outdoor structure, and a housing 30 coupled to the base member. In various embodiments, housing 30 is opaque or translucent, such that any equipment positioned therein cannot be clearly seen by the naked eye.

Figure 3:
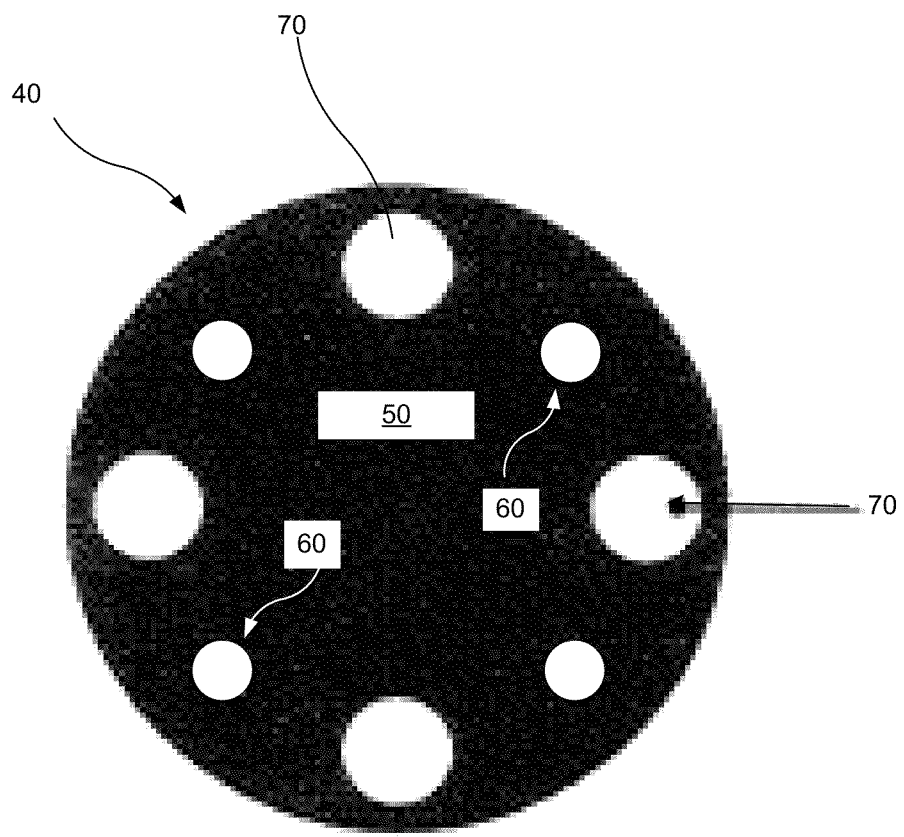
FIG. 3 is a top view of a shelf of the enclosure of FIG. 1.

At least one shelf 40 is disposed within the housing 30. As best seen in FIG. 3, in an embodiment, each shelf 40 has a support surface 50, a plurality of support orifices 60 disposed therethrough, and communication orifices 70 disposed therethrough. Referring back to FIG. 1, enclosure 10 further includes a plurality of support members, such as rods 80, configured to be inserted through the support orifices 60.

Figure 2:
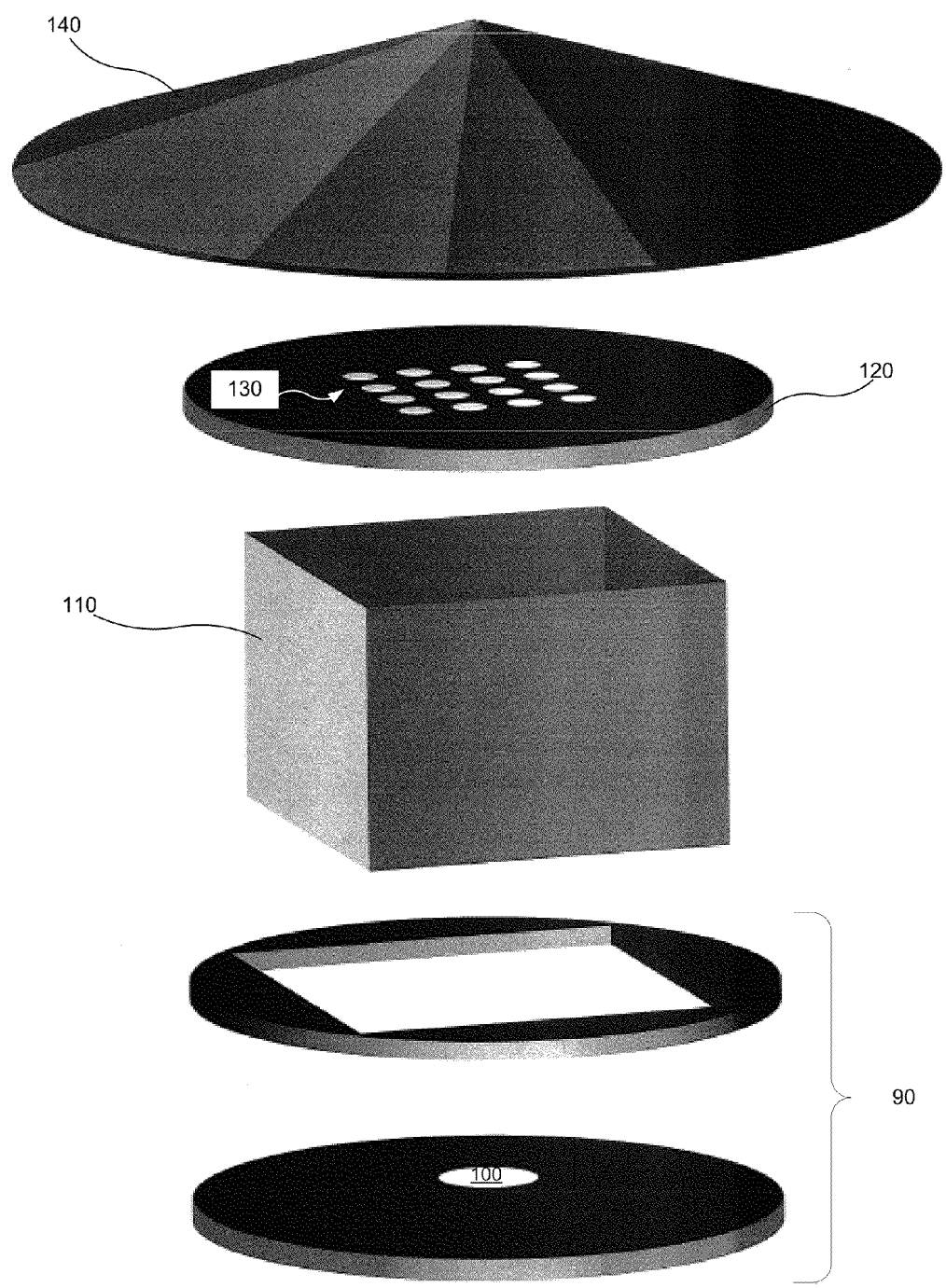
FIG. 2 is an exploded view of elements of the enclosure of FIG. 1.

As best seen in FIG. 2, a floor member 90 is coupled to the housing 30. Floor member 90 may be a single piece or, as illustrated in FIG. 2, constructed from multiple pieces. Floor member 90 has at least one communication orifice 100 disposed therethrough. The rods 80 are configured to couple the shelves 40 to the floor member 90. A substantially transparent housing 110 is mounted on the floor member 90. Housing 110 may be composed of a clear or smoked acrylic, for example. A lid 120 is configured for mounting on the housing 110 and includes venting orifices 130 disposed therethrough. A canopy member 140 is mounted on the lid 120.

In operation of enclosure 10, a surveillance camera, or lens of such a camera (not shown), may be placed in housing 110 for discreet surveillance of the vicinity of the enclosure. Shelves 40 may be used to support equipment (not shown) associated with the surveillance camera. Wiring or other connective elements may be threaded through communication orifices 70, 100 to allow communication among surveillance equipment elements positioned in housing 110 and on shelves 40. In an embodiment, housing 110 may be covered with wire meshing (not shown) to better conceal the surveillance equipment disposed therein.

Alternatively, an embodiment can be disguised as every day, ordinary things one would see on a building or in the city, repurposed to hold surveillance equipment. These things, include, but are not limited to, cable boxes, utility boxes, mailboxes, electrical boxes, such as those found on street corners for traffic signals, and the like.

Figure 4:
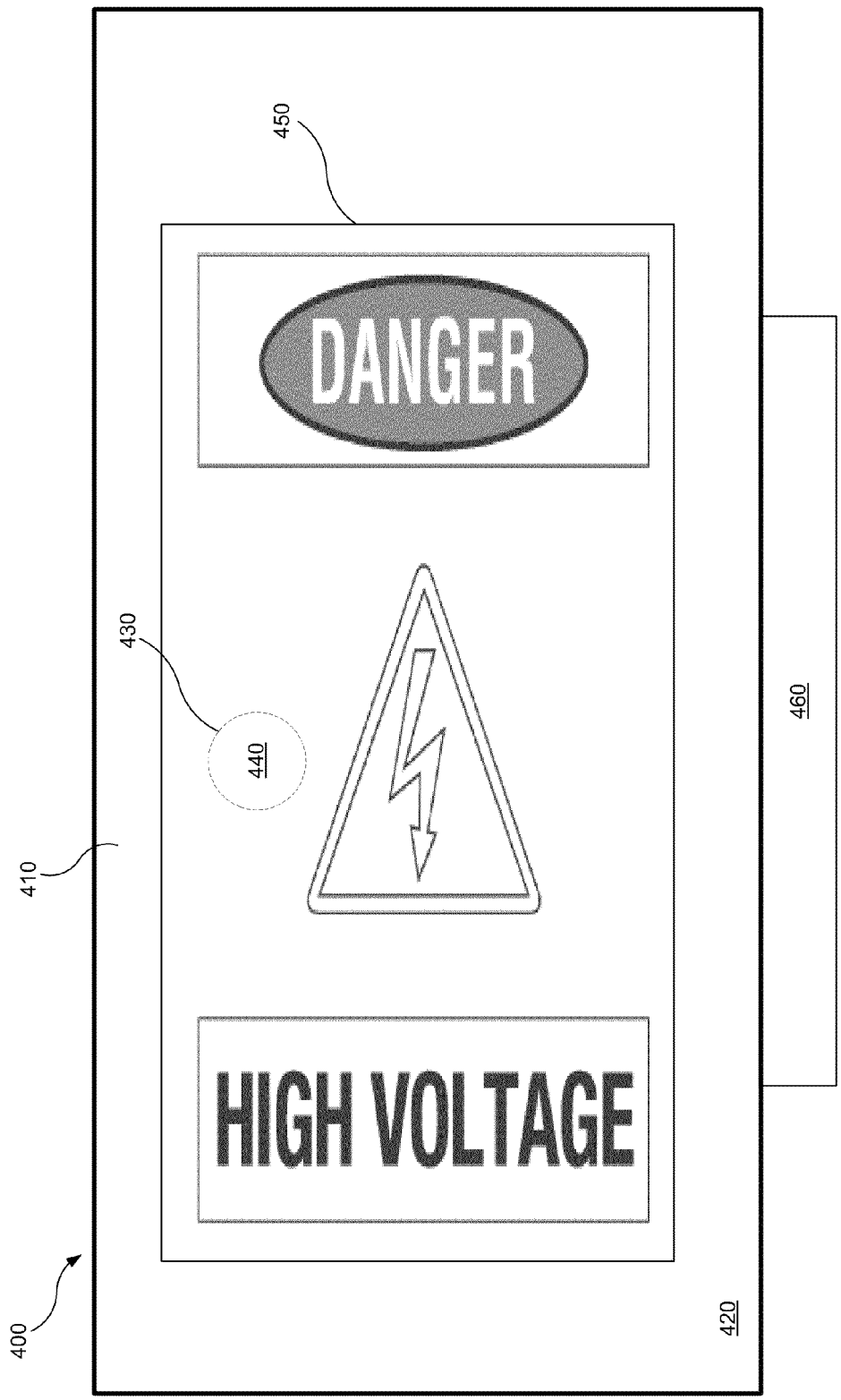
FIG. 4 is a side view of an enclosure in accordance with an illustrative embodiment of the invention.

Specifically, and referring to FIG. 4, a waterproof enclosure 400, having the appearance of a utility box, for example, includes a housing 410 having a surface 420. As indicated by the dashed circle, the surface 420 includes an optical orifice 430 disposed therethrough. A substantially transparent lens 440 is disposed within the optical orifice 430. Lens 440 may be clear or smoked, for example. A film 450 is disposed on the surface 420 and covers the optical orifice 430. The film 450 is at least partially transparent and can include a graphic design to camouflage the optical orifice 430. The film 450 may be constructed from, for example, perforated vinyl, cut vinyl, or other appropriate transparent material.

The enclosure 400 may further include a base member 460 configured to be coupled to the housing 410 and the exterior of an outdoor structure (not shown). In an embodiment, base member 460 may include aluminum mounting brackets.

In operation of enclosure 400, a surveillance camera, or lens of such a camera (not shown), may be placed in housing 410 for discreet surveillance, via lens 440, of the vicinity of the enclosure.

Alternatively, an embodiment fits into the interior of a vehicle, anchored to a door, window or other appropriate structure. Such an embodiment is configured to easily install in a variety of different vehicles. It may be constructed of strong, lightweight aluminum plate and rod. It may include an infinitely adjustable tensioning system to hold itself and mounted equipment in place and fit a wide variety of vehicle windows and/or doors. In one embodiment, an optional black finish helps the unit to be less visible and blend into surroundings. It may include a unique component design that incorporates multiple shelves, can be portable and lightweight and require no tools for installation.

Figure 5:
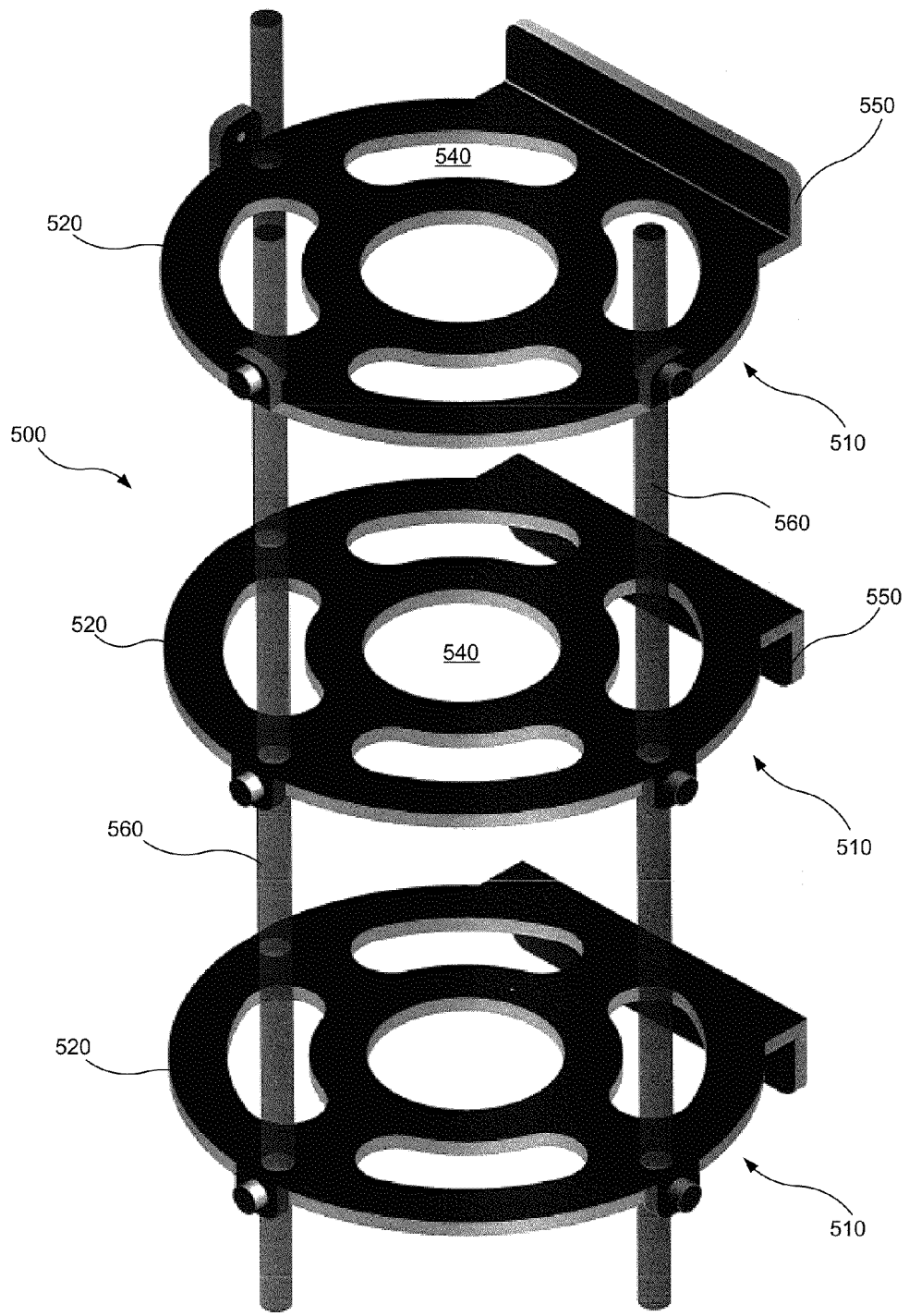
FIG. 5 is a top perspective view of a rack for supporting electronic equipment within an interior of a vehicle in accordance with an illustrative embodiment of the invention.
Figure 6:
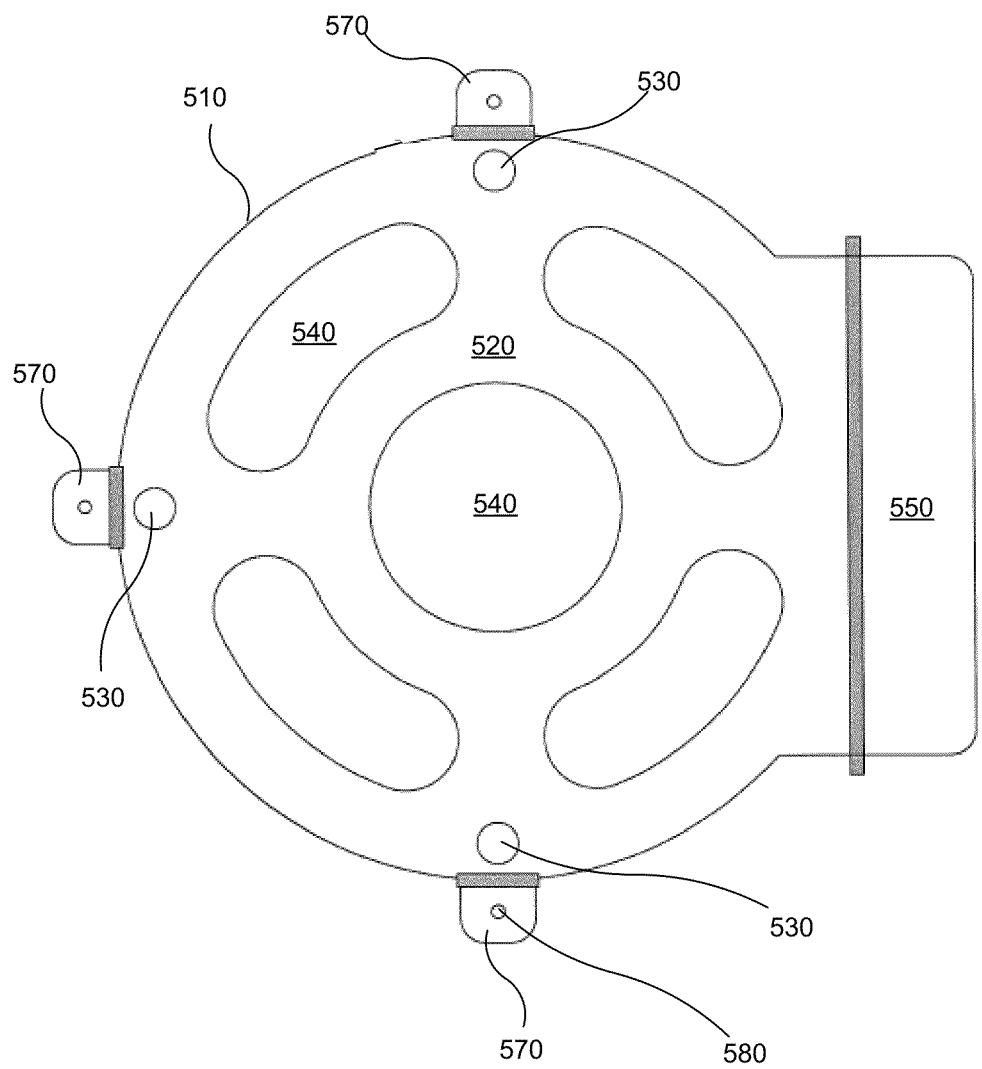
FIG. 6 is a top view of a shelf of the rack of FIG. 5 in accordance with an illustrative embodiment of the invention.

Specifically, and referring to FIGS. 5 and 6, a rack 500 for supporting electronic equipment within an interior of a vehicle (not shown) includes a plurality of shelves 510. Each shelf 510 includes a support surface 520, a plurality of support orifices 530 disposed therethrough, and at least one communication orifice 540 disposed therethrough.

Each shelf 510 has a primary flexible flange member 550 coupled to a respective support surface 520 and configured to be adjustably angled by hand relative to the support surface. Each primary flange member 550 is configured to engage a surface, such as, for example, a window or door, of the interior of the vehicle.

Rack 500 further includes a plurality (in the example illustrated in FIG. 5, three) of support members 560, such as dowels or rods, configured to be inserted through the support orifices 530 and couple each shelf 510 to at least one other of the shelves. A plurality of secondary flexible flange members 570 are disposed proximal to the support orifices 530 and have an orifice 580 therethrough, which may be threaded. Orifices 580 are configured to receive a screw or other device appropriate to secure members 570 and, consequently, shelves 510 to support members 560.

In operation of rack 500, a surveillance camera, or lens of such a camera (not shown), may be placed on one or more of shelves 510 for discreet surveillance of the vicinity of the vehicle in which the rack is disposed. Shelves 510 may be used to support equipment (not shown) associated with the surveillance camera. Wiring or other connective elements may be threaded through communication orifices 540 to allow communication among surveillance equipment elements positioned on different ones of shelves 510.

Figure 7:
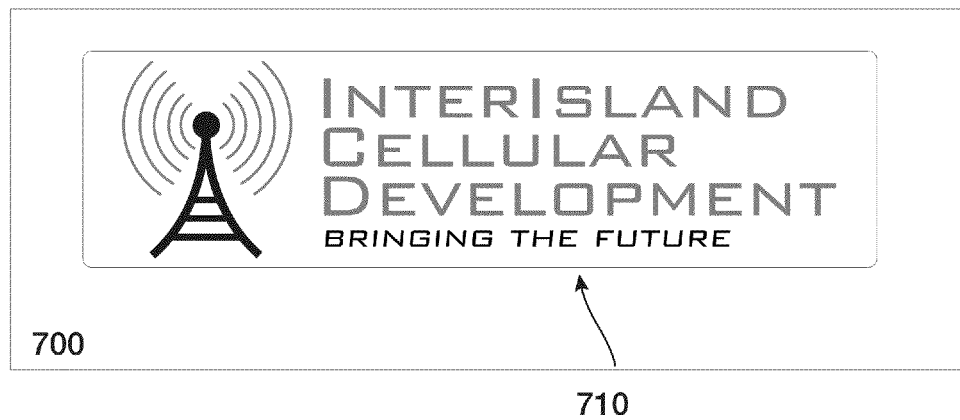
FIG. 7 is illustrates signage in accordance with an illustrative embodiment of the invention.
Figure 7:
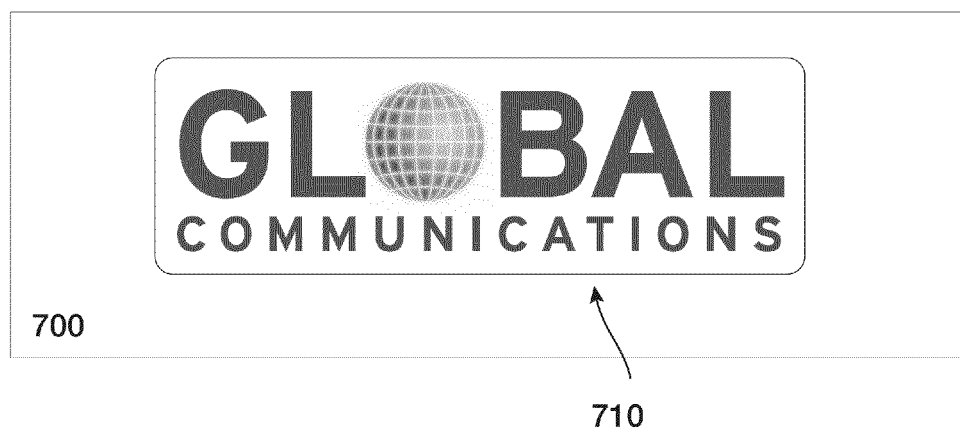

As illustrated in FIG. 7, yet aspect of an embodiment of the invention includes signage 700 including misleading graphics 710 designed to disguise, for example, a vehicle in which rack 500 is situated, so that when an officer is installing the surveillance equipment, their vehicle does not look suspicious. These signs affix to the sides of vehicles and, in one embodiment of the invention, include, but are not limited to, being attached easily by strong magnets.

While the preferred embodiment of the invention has been illustrated and described, as noted above, many changes can be made without departing from the spirit and scope of the invention. Accordingly, the scope of the invention is not limited by the disclosure of the preferred embodiment.

What is claimed is:

1. An apparatus for supporting electronic equipment on the exterior of an outdoor structure configured to facilitate covert surveillance, comprising:
    a base member configured to be coupled to the exterior of the outdoor structure;
    a housing having a first surface, the first surface including an optical orifice disposed therethrough;
    the housing configured to be coupled to the base member;
    a substantially transparent lens disposed within the optical orifice;
    a film member disposed on the first surface and covering the optical orifice, the film member being at least partially transparent, the film member including a graphic design configured to camouflage the optical orifice;
    at least one shelf disposed within the housing, each said shelf having a support surface, each said shelf having a plurality of support orifices disposed therethrough, each said shelf having at least one first communication orifice disposed therethrough;
    a plurality of support members configured to be inserted through the support orifices; and
    a floor member coupled to first housing and having at least one second communication orifice disposed therethrough, the plurality of support members configured to couple the at least one shelf to the floor member.

2. An apparatus for supporting electronic equipment on the exterior of an outdoor structure configured to facilitate covert surveillance comprising:
    a base member configured to be coupled to the exterior of the outdoor structure;
    a first housing coupled to the base member;
    at least one shelf disposed within the first housing, each said shelf having a support surface, each said shelf having a plurality of support orifices disposed therethrough, each said shelf having at least one first communication orifice disposed therethrough;
    a plurality of support members configured to be inserted through the support orifices;
    a floor member coupled to the first housing and having at least one second communication orifice disposed therethrough, the plurality of support members configured to couple the at least one shelf to the floor member; and
    a substantially transparent second housing mounted on the floor member.

3. The apparatus of claim 2, further comprising a lid member configured for mounting on the second housing, the lid member including venting orifices disposed therethrough.

4. The lid member of claim 3, further comprising a canopy member configured for mounting on the lid member.

5. The apparatus of claim 2 wherein the apparatus is further sized and configured to fit within an item selected from the list including cable boxes, utility boxes, mailboxes, electrical boxes and traffic signals.

6. The apparatus of claim 2 wherein the apparatus is further configured to fit within a vertically oriented cylindrical shape such as a metal roof chimney.

* * * * *